United States Patent
Lee (10) Patent No.: US 9,543,042 B2
(45) Date of Patent: Jan. 10, 2017

(54) SEMICONDUCTOR MEMORY APPARATUS

(71) Applicant: SK hynix Inc., Icheon-si, Gyeonggi-do (KR)

(72) Inventor: Dong Uk Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/673,333

(22) Filed: Mar. 30, 2015

(65) Prior Publication Data
US 2016/0180966 A1 Jun. 23, 2016

(30) Foreign Application Priority Data
Dec. 22, 2014 (KR) .................. 10-2014-0186125

(51) Int. Cl.
G11C 29/38 (2006.01)
G11C 29/40 (2006.01)
G11C 29/54 (2006.01)

(52) U.S. Cl.
CPC .............. G11C 29/38 (2013.01); G11C 29/40 (2013.01)

(58) Field of Classification Search
CPC ......... G11C 29/38; G11C 29/36; G11C 29/56; G11C 29/48; G11C 29/40
See application file for complete search history.

(56) References Cited

U.S. PATENT DOCUMENTS

| 5,568,437 A * | 10/1996 | Jamal | G11C 29/44 365/189.07 |
| 5,596,616 A * | 1/1997 | Jeang | G11C 7/1018 377/56 |
| 2002/0073367 A1 * | 6/2002 | Hartmann | G11C 29/26 714/719 |
| 2002/0132379 A1 * | 9/2002 | Chang | G01R 31/31905 438/14 |
| 2008/0046788 A1 * | 2/2008 | Lee | G11C 29/1201 714/718 |
| 2008/0074139 A1 * | 3/2008 | Kim | H03K 19/01754 326/30 |

FOREIGN PATENT DOCUMENTS

KR 101083675 B1 11/2011

* cited by examiner

*Primary Examiner* — April Y Blair
*Assistant Examiner* — Dipakkumar Gandhi
(74) *Attorney, Agent, or Firm* — William Park & Associates Ltd.

(57) ABSTRACT

A semiconductor memory apparatus includes a first comparison block configured to compare a plurality of channel data with one another and generate a first comparison signal, or output one of the plurality of channel data as the first comparison signal, in response to a plurality of channel select signals; a second comparison block configured to compare the plurality of channel data and generate a second comparison signal when the plurality of channel select signals have a predetermined combination and a channel detection signal has a predetermined logic level; a channel selection detection block configured to enable the channel detection signal when only one channel select signal among the plurality of channel select signals is enabled; and a combined output block configured to enable a test result signal when at least one comparison signal of the first and second comparison signals is enabled.

10 Claims, 3 Drawing Sheets

FIG.3

SEMICONDUCTOR MEMORY APPARATUS

CROSS-REFERENCES TO RELATED APPLICATION

The present application claims priority under 35 U.S.C. §119(a) to Korean application number 10-2014-0186125 filed on Dec. 22, 2014, in the Korean Intellectual Property Office, which is incorporated herein by reference in its entirety.

BACKGROUND

1. Technical Field

Various embodiments generally relate to a semiconductor integrated circuit, and more particularly to a semiconductor memory apparatus.

2. Related Art

As integrated circuits continue to shrink in size, a three-dimensional integrated circuit becomes a natural alternative to continued advances. A three-dimensional integrated circuit packaging is, among other things, an integrated circuit manufactured by stacking a plurality of semiconductor chips. One of the advantages of the three-dimensional integrated circuit packaging is that the plurality of semiconductor chips can operate at the same time, and it is possible to increase the amount of data that can be transmitted at the same time by increasing the number of channels between the plurality of semiconductor chips.

A large number of channels between the semiconductor chips entail a large number of junctions, and these may cause defects. Due to the increase in the number of channels, however, test time reduction is considered a major challenge.

SUMMARY

In an embodiment, a semiconductor memory apparatus may include: a first comparison block configured to compare a plurality of channel data with one another and generate a first comparison signal, or output one of the plurality of channel data as the first comparison signal, in response to a plurality of channel select signals; a second comparison block configured to compare the plurality of channel data and generate a second comparison signal, according to the plurality of channel select signals and a channel detection signal; a channel selection detection block configured to enable the channel detection signal when only one channel select signal among the plurality of channel select signals is enabled; and a combined output block configured to enable a test result signal when even one comparison signal of the first and second comparison signals is enabled.

In an embodiment, a semiconductor memory apparatus may include: a first test circuit configured to compare a first plurality of channel data and generate a first test result signal or output one channel data among the first plurality of channel data as the first test result signal, according to a first plurality of channel select signals; a second test circuit configured to compare a second plurality of channel data and generate a second test result signal or output one channel data among the second plurality of channel data as the second test result signal, according to a second plurality of channel select signals; and a test result output circuit configured to sequentially output the first and second test result signals as a serial test result signal in response to a test result output control signal.

DETAILED DESCRIPTION

Figure 1:
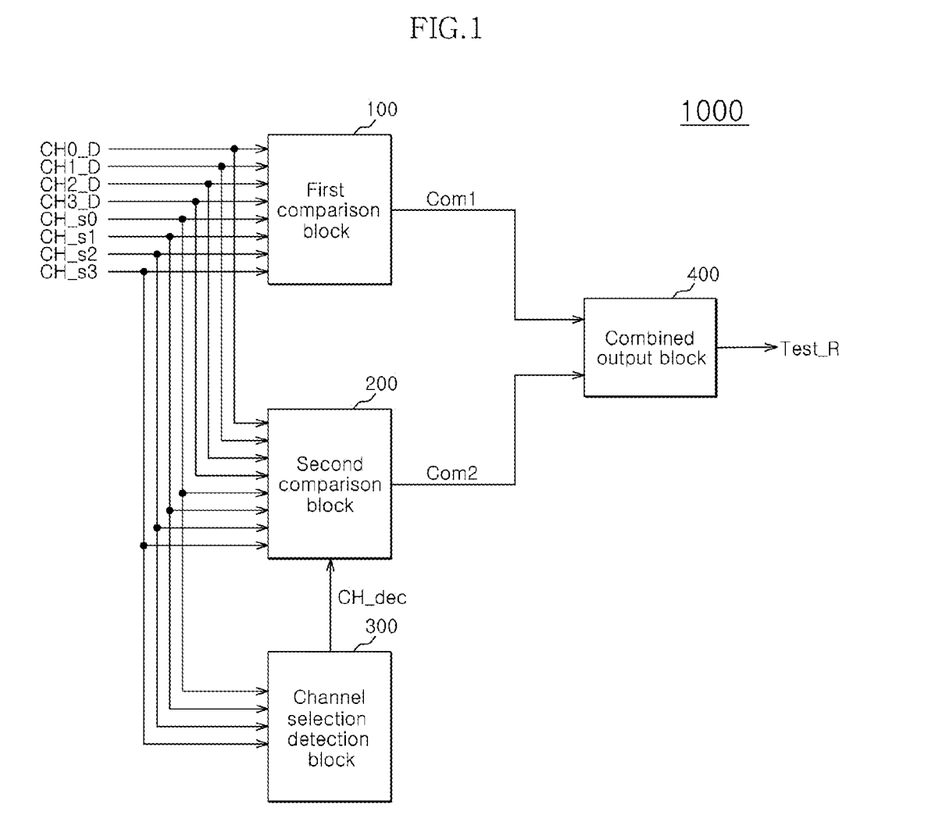
FIG. 1 is a configuration diagram illustrating an example of a semiconductor memory apparatus in accordance with an embodiment.

FIG. 1 is a configuration diagram illustrating an example of a semiconductor memory apparatus in accordance with an embodiment.

As shown in FIG. 1, a test circuit 1000, which is included in a semiconductor memory apparatus in accordance with an embodiment, may include a first comparison block 100, a second comparison block 200, a channel selection detection block 300, and a combined output block 400.

The first comparison block 100 may generate a first comparison signal Com1 by comparing first to fourth channel data CH0_D, CH1_D, CH2_D and CH3_D with one another according to first to fourth channel select signals CH_s0, CH_s1, CH_s2 and CH_s3, or output one channel data selected between the first to fourth channel data CH0_D, CH1_D, CH2_D and CH3_D, as the first comparison signal Com1. For example, when all the first to fourth channel select signals CH_s0, CH_s1, CH_s2 and CH_s3 are enabled, the first comparison block 100 generates the first comparison signal Com1 by determining whether all the first to fourth channel data CH0_D, CH1_D, CH2_D and CH3_D are the same with one another. For example, when all the first to fourth channel select signals CH_s0, CH_s1, CH_s2 and CH_s3 are enabled, the first comparison block 100 generates the first comparison signal Com1 which is determined based on whether or not the first to fourth channel data CH0_D, CH1_D, CH2_D and CH3_D have a predetermined combination. For example, when all the first to fourth channel select signals CH_s0, CH_s1, CH_s2 and CH_s3 are enabled, the first comparison block 100 may generate the first comparison signal Com1 having a logic high level if all the first to fourth channel data CH0_D, CH1_D, CH2_D and CH3_D have logic high levels. Also, when only one channel select signal selected between the first to fourth channel select signals CH_s0, CH_s1, CH_s2 and CH_s3 is enabled, the first comparison block 100 outputs the channel data corresponding to the enabled channel select signal, as the first comparison signal Com1. For example, when only the first channel select signal CH_s0 selected between the first to fourth channel select signals CH_s0, CH_s1, CH_s2 and CH_s3 is enabled, the first comparison block 100 outputs the first channel data CH0_D as the first comparison signal Com1. When only the second channel select signal CH_s1 selected between the first to fourth channel select signals CH_s0, CH_s1, CH_s2 and CH_s3 is enabled, the first comparison block 100 outputs the second channel data CH1_D as the first comparison signal Com1. When only the third channel select signal CH_s2 selected between the first to fourth channel select signals CH_s0, CH_s1, CH_s2 and CH_s3 is enabled, the first comparison block 100 outputs the third channel data CH2_D as the first comparison signal Com1. When only the fourth channel select signal CH_s3 selected between the first to fourth channel select signals CH_s0, CH_s1, CH_s2 and CH_s3 is enabled, the first comparison block 100 outputs the fourth channel data CH3_D as the first comparison signal Com1.

The second comparison block 200 compares the first to fourth channel data CH0_D, CH1_D, CH2_D and CH3_D in a situation where the first to fourth channel select signals CH_s0, CH_s1, CH_s2 and CH_s3 have a predetermined combination and a channel detection signal CH_dec has a predetermined logic level. For example, when all the first to fourth channel select signals CH_s0, CH_s1, CH_s2 and CH_s3 are enabled and the channel detection signal CH_dec is disabled, the second comparison block 200 compares the first to fourth channel data CH0_D, CH1_D, CH2_D and CH3_D and generates the second comparison signal Com2. For example, when all the first to fourth channel select signals CH_s0, CH_s1, CH_s2 and CH_s3 are enabled and the channel detection signal CH_dec is disabled, the second comparison block 200 may generate the second comparison signal Com2 having a logic high level if all the first to fourth channel data CH0_D, CH1_D, CH2_D and CH3_D have logic high levels. Also, the second comparison block 200 may generate the second comparison signal Com2 having a predetermined logic level when the channel detection signal CH_dec is enabled, regardless of the first to fourth channel data CH0_D, CH1_D, CH2_D and CH3_D.

The channel selection detection block 300 may enable the channel detection signal CH_dec when only one channel select signal selected between the first to fourth channel select signals CH_s0, CH_s1, CH_s2 and CH_s3 is enabled. For example, the channel selection detection block 300 enables the channel detection signal CH_dec when only the first channel select signal CH_s0 selected between the first to fourth channel select signals CH_s0, CH_s1, CH_s2 and CH_s3 is enabled. The channel selection detection block 300 enables the channel detection signal CH_dec when only the second channel select signal CH_s1 selected between the first to fourth channel select signals CH_s0, CH_s1, CH_s2 and CH_s3 is enabled. The channel selection detection block 300 enables the channel detection signal CH_dec when only the third channel select signal CH_s2 selected between the first to fourth channel select signals CH_s0, CH_s1, CH_s2 and CH_s3 is enabled. The channel selection detection block 300 enables the channel detection signal CH_dec when only the fourth channel select signal CH_s3 selected between the first to fourth channel select signals CH_s0, CH_s1, CH_s2 and CH_s3 is enabled.

The combined output block 400 may generate a test result signal Test_R in response to the first and second comparison signals Com1 and Com2. For example, the combined output block 400 enables the test result signal Test_R when even one of the first and second comparison signals Com1 and Com2 is enabled.

Figure 2:
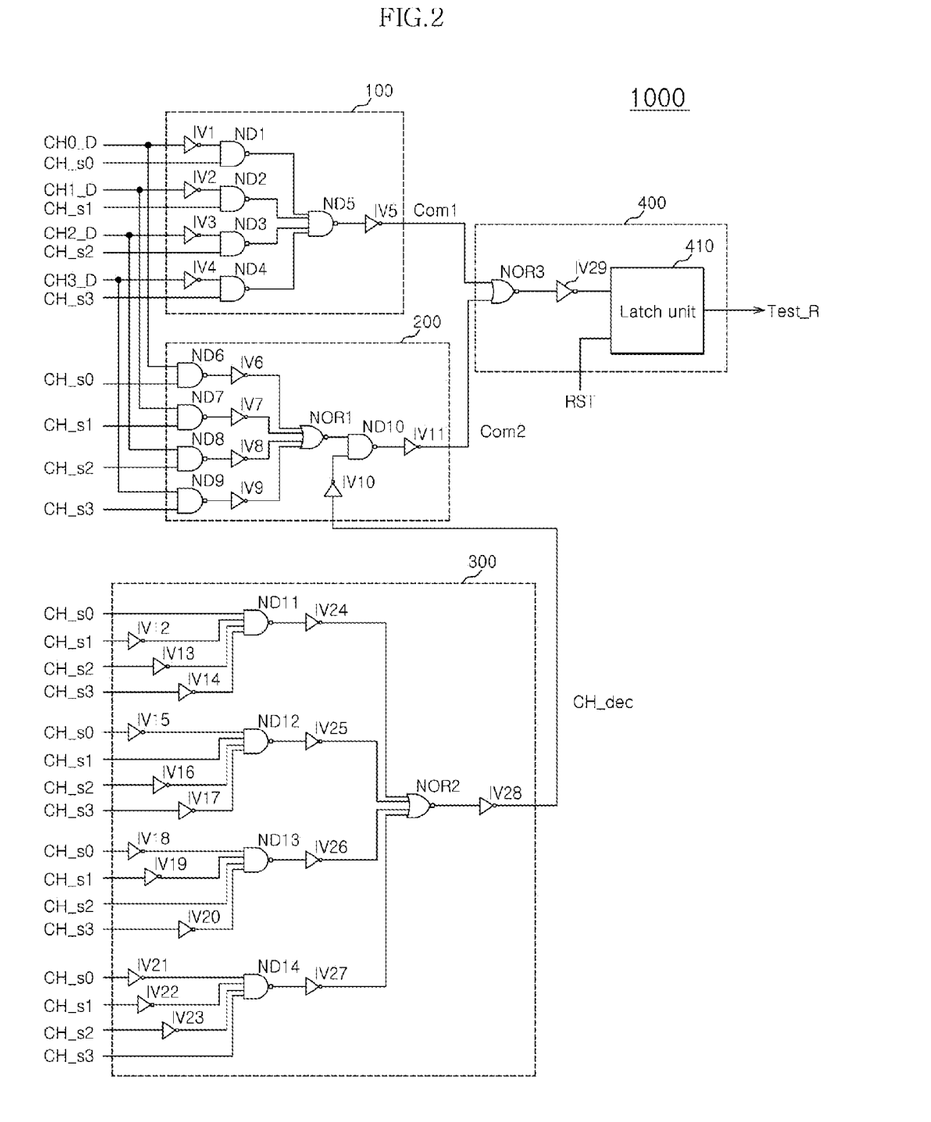
FIG. 2 is a configuration diagram illustrating in detail the semiconductor memory apparatus in accordance with an embodiment.

As shown in FIG. 2, the first comparison block 100 may include first to fifth inverters IV1, IV2, IV3, IV4 and IV5, and first to fifth NAND gate ND1, ND2, ND3, ND4 and ND5. The first inverter IV1 receives the first channel data CH0_D. The second inverter IV2 receives the second channel data CH1_D. The third inverter IV3 receives the third channel data CH2_D. The fourth inverter IV4 receives the fourth channel data CH3_D. The first NAND gate ND1 receives the output signal of the first inverter IV1 and the first channel select signal CH_s0. The second NAND gate ND2 receives the output signal of the second inverter IV2 and the second channel select signal CH_s1. The third NAND gate ND3 receives the output signal of the third inverter IV3 and the third channel select signal CH_s2. The fourth NAND gate ND4 receives the output signal of the fourth inverter IV4 and the fourth channel select signal CH_s3. The fifth NAND gate ND5 receives the output signals of the first to fourth NAND gates ND1, ND2, ND3 and ND4. The fifth inverter IV5 receives the output signal of the fifth NAND gate ND5, and outputs the first comparison signal Com1.

The first comparison block 100 according to an embodiment may output the first comparison signal Com1 which is enabled to a high level if all the first to fourth channel select signals CH_s0, CH_s1, CH_s2 and CH_s3 are enabled to a high level and all the first to fourth channel data CH0_D, CH1_D, CH2_D and CH3_D are a high level. Where all the first to fourth channel select signals CH_s0, CH_s1, CH_s2 and CH_s3 are enabled to the high level, the first comparison block 100 may output the first comparison signal Com1 which is disabled to a low level if at least one of the first to fourth channel data CH0_D, CH1_D, CH2_D and CH3_D has a low level. Further, when only one channel select signal selected between the first to fourth channel select signals CH_s0, CH_s1, CH_s2 and CH_s3 is enabled, the first comparison block 100 outputs the channel data corresponding to the enabled channel select signal as the first comparison signal Com1. For example, the first comparison block 100 outputs the first channel data CH0_D as the first comparison signal Com1 when only the first channel select signal CH_s0 is enabled. The first comparison block 100 outputs the second channel data CH1_D as the first comparison signal Com1 when only the second channel select signal CH_s1 is enabled. The first comparison block 100 outputs the third channel data CH2_D as the first comparison signal Com1 when only the third channel select signal CH_s2 is enabled. The first comparison block 100 outputs the fourth channel data CH3_D as the first comparison signal Com1 when only the fourth channel select signal CH_s3 is enabled.

As shown in FIG. 2, the second comparison block 200 may include sixth to tenth NAND gates ND6, ND7, ND8, ND9 and ND10, sixth to eleventh inverters IV6, IV7, IV8, IV9, IV10 and IV11, and a first NOR gate NOR1. The sixth NAND gate ND6 receives the first channel data CH0_D and the first channel select signal CH_s0. The seventh NAND gate ND7 receives the second channel data CH0_D and the second channel select signal CH_s1. The eighth NAND gate ND8 receives the third channel data CH2_D and the third channel select signal CH_s2. The ninth NAND gate ND9 receives the fourth channel data CH3_D and the fourth channel select signal CH_s3. The sixth inverter IV6 receives the output signal of the sixth NAND gate ND6. The seventh inverter IV7 receives the output signal of the seventh NAND gate ND7. The eighth inverter IV8 receives the output signal of the eighth NAND gate ND8. The ninth inverter IV9 receives the output signal of the ninth NAND gate ND9. The first NOR gate NOR1 receives the output signals of the sixth to ninth inverters IV6, IV7, IV8 and IV9. The tenth inverter IV10 receives the channel detection signal CH_dec. The tenth NAND gate ND10 receives the output signal of the tenth inverter IV10 and the output signal of the first NOR gate NOR1. The eleventh inverter IV11 receives the output signal of the tenth NAND gate ND10, and outputs the second comparison signal Com2.

When the channel detection signal CH_dec has the logic low level and all the first to fourth channel select signals CH_s0, CH_s1, CH_s2 and CH_s3 have the logic high levels, the second comparison signal Com2 being generated by the second comparison block 200 may be determined in response to the first to fourth channel data CH0_D, CH1_D, CH2_D and CH3_D. For example, when the channel detection signal CH_dec has the logic low level and all the first to fourth channel select signals CH_s0, CH_s1, CH_s2 and CH_s3 have the logic high levels, the second comparison block 200 outputs the second comparison signal Com2 which is enabled to a high level if all the first to fourth channel data CH0_D, CH1_D, CH2_D and CH3_D have the logic low levels. For example, when the channel detection signal CH_dec has the logic low level and all the first to fourth channel select signals CH_s0, CH_s1, CH_s2 and CH_s3 have the logic high levels, if at least one of the first to fourth channel data CH0_D, CH1_D, CH2_D and CH3_D has the logic high level, the second comparison block 200 outputs the second comparison signal Com2 which is disabled to a low level. When the channel detection signal CH_dec is enabled to a high level, the second comparison signal Com2 remains at the logic low level regardless of the first to fourth channel data CH0_D, CH1_D, CH2_D and CH3_D.

As shown in FIG. 2, the channel selection detection block 300 may include twelfth to twenty-eighth inverters IV12 to IV28, eleventh to fourteenth NAND gates ND11, ND12, ND13 and ND14, and a second NOR gate NOR2. The twelfth inverter IV12 receives the second channel select signal CH_s1. The thirteenth inverter IV13 receives the third channel select signal CH_s2. The fourteenth inverter IV14 receives the fourth channel select signal CH_s3. The eleventh NAND gate ND11 receives the first channel select signal CH_s0 and the output signals of the twelfth to fourteenth inverters IV12, IV13 and IV14. The fifteenth inverter IV15 receives the first channel select signal CH_s0. The sixteenth inverter IV16 receives the third channel select signal CH_s2. The seventeenth inverter IV17 receives the fourth channel select signal CH_s3. The twelfth NAND gate ND12 receives the output signals of the fifteenth to seventeenth inverters IV15, IV16 and IV17 and the second channel select signal CH_s1. The eighteenth inverter IV18 receives the first channel select signal CH_s0. The nineteenth inverter IV19 receives the second channel select signal CH_s1. The twentieth inverter IV20 receives the fourth channel select signal CH_s3. The thirteenth NAND gate ND13 receives the output signals of the eighteenth to twentieth inverters IV18, 1V19 and IV20 and the third channel select signal CH_s2. The twenty-first inverter IV21 receives the first channel select signal CH_s0. The twenty-second inverter IV22 receives the second channel select signal CH_s1. The twenty-third inverter IV23 receives the third channel select signal CH_s2. The fourteenth NAND gate ND14 receives the output signals of the twenty-first to twenty-third inverters IV21, 1V22 and IV23 and the fourth channel select signal CH_s3. The twenty-fourth inverter IV24 receives the output signal of the eleventh NAND gate ND11. The twenty-fifth inverter IV25 receives the output signal of the twelfth NAND gate ND12. The twenty-sixth inverter IV26 receives the output signal of the thirteenth NAND gate ND13. The twenty-seventh inverter IV27 receives the output signal of the fourteenth NAND gate ND14. The second NOR gate NOR2 receives the output signals of the twenty-fourth to twenty-seventh inverters IV24, 1V25, 1V26 and IV27. The twenty-eighth inverter IV28 receives the output signal of the second NOR gate NOR2, and outputs the channel detection signal CH_dec.

The channel selection detection block 300 may disable the channel detection signal CH_dec to the low level when all the first to fourth channel select signals CH_s0, CH_s1, CH_s2 and CH_s3 are disabled. The channel selection detection block 300 enables the channel detection signal CH_dec to the high level when any one channel select signal selected between the first to fourth channel select signals CH_s0, CH_s1, CH_s2 and CH_s3 is enabled.

The combined output block 400 may include a third NOR gate NOR3, a twenty-ninth inverter IV29, and a latch unit 410. The third NOR gate NOR3 receives the first and second comparison signals Com1 and Com2. The twenty-ninth inverter IV29 receives the output signal of the third NOR gate NOR3. The latch unit 410 may store the output signal of the twenty-ninth inverter IV29, and output the test result signal Test_R. The latch unit 410 may initialize (e.g., disable) the stored signal and the test result signal Test_R in response to a reset signal RST.

The combined output block 400 may output the test result signal Test_R which is enabled, when at least one of the first and second comparison signals Com1 and Com2 is enabled. The combined output block 400 outputs the test result signal Test_R which is disabled, when both the first and second comparison signals Com1 and Com2 are disabled.

Operations of the semiconductor memory apparatus in accordance with an embodiment will be described below.

For example, data of the same level are stored in the semiconductor memory apparatus in which a plurality of semiconductor chips are stacked.

All the first to fourth channel select signals CH_s0, CH_s1, CH_s2 and CH_s3 are enabled.

First, it is assumed that data stored in the semiconductor memory apparatus have high levels.

When all the first to fourth channel select signals CH_s0, CH_s1, CH_s2 and CH_s3 are enabled, the first comparison block 100 enables the first comparison signal Com1 to the high level if all the first to fourth channel data CH0_D, CH1_D, CH2_D and CH3_D have the logic high level.

When all the first to fourth channel select signals CH_s0, CH_s1, CH_s2 and CH_s3 are enabled, the first comparison block 100 disables the first comparison signal Com1 to the low level if at least one channel data of the first to fourth channel data CH0_D, CH1_D, CH2_D and CH3_D has the logic low level.

The channel selection detection block 300 disables the channel detection signal CH_dec when all the first to fourth channel select signals CH_s0, CH_s1, CH_s2 and CH_s3 are enabled.

When the channel detection signal CH_dec is disabled and all the first to fourth channel select signals CH_s0, CH_s1, CH_s2 and CH_s3 are enabled, the second comparison block 200 outputs the second comparison signal Com2 which is disabled to the low level, when at least one of the first to fourth channel data CH0_D, CH1_D, CH2_D and CH3_D has the logic high level. Therefore, in the case where the data stored in the semiconductor memory apparatus have the high level, when the test described above is performed, the second comparison block 200 outputs the second comparison signal Com2 which is disabled to the low level.

The combined output block 400 generates the test result signal Test_R which is enabled, when at least one of the first and second comparison signals Com1 and Com2 is enabled.

When each bit of data stored in a semiconductor memory cell being tested is logic high level, and each semiconductor memory cell may be tested by checking whether or not all the data bit read from the semiconductor memory cells have logic high level, the second comparison signal Com2 is disabled unless all the bits have become logic low levels. For example, when the first to fourth channel data CH0_D, CH1_D, CH2_D and CH3_D, which are data being tested, have logic high levels, the second comparison signal Com2 is disabled unless all the first to fourth channel data CH0_D, CH1_D, CH2_D and CH3_D are changed to logic low levels, which means all the data are stored in failed memory cells. Also, the first comparison signal Com1 is enabled when the first to fourth channel data CH0_D, CH1_D, CH2_D and CH3_D, which are data being tested, have logic high levels. The first comparison signal Com1 is disabled when at least one channel data selected between the first to fourth channel data CH0_D, CH1_D, CH2_D and CH3_D is the low level.

Therefore, when the semiconductor memory apparatus is tested, the fact that the test result signal Test_R is enabled means that all the read-out data (e.g., all the first to fourth channel data CH0_D, CH1_D, CH2_D and CH3_D) have logic high levels. Hence, the fact that the test result signal Test_R is enabled means that the semiconductor memory apparatus does not include a failed memory cell. Moreover, when the semiconductor memory apparatus is tested, the fact that the test result signal Test_R is disabled means that at least one channel data among all the channel data (e.g., all the first to fourth channel data CH0_D, CH1_D, CH2_D and CH3_D) is the low level. Hence, the fact that the test result signal Test_R is disabled means that the semiconductor memory apparatus includes at least one failed memory cell or at least one failed channel.

Secondly, it is assumed that the data stored in the semiconductor memory apparatus have a low level.

The channel selection detection block 300 disables the channel detection signal CH_dec when all the first to fourth channel select signals CH_s0, CH_s1, CH_s2 and CH_s3 are enabled.

When the channel detection signal CH_dec is disabled and all the first to fourth channel select signals CH_s0, CH_s1, CH_s2 and CH_s3 are enabled, the second comparison block 200 enables the second comparison signal Com2 to the high level if all the first to fourth channel data CH0_D, CH1_D, CH2_D and CH3_D have the logic low levels.

When the channel detection signal CH_dec is disabled and all the first to fourth channel select signals CH_s0, CH_s1, CH_s2 and CH_s3 are enabled, the second comparison block 200 disables the second comparison signal Com2 to the low level if at least one channel data selected between the first to fourth channel data CH0_D, CH1_D, CH2_D and CH3_D has the logic high level.

When all the first to fourth channel select signals CH_s0, CH_s1, CH_s2 and CH_s3 are enabled, the first comparison block 100 outputs the first comparison signal Com1 which is disabled to the low level if at least one of the first to fourth channel data CH0_D, CH1_D, CH2_D and CH3_D has the logic low level. Therefore, in the case where the data stored in the semiconductor memory apparatus have the low level, when the test described above is performed, the first comparison block 100 outputs the first comparison signal Com1 which is disabled to the low level.

The combined output block 400 generates the test result signal Test_R which is enabled, when at least one of the first and second comparison signals Com1 and Com2 is enabled.

When each bit of data stored in a semiconductor memory cell being tested is logic low level, and each semiconductor memory cell may be tested by checking whether or not all the data bit read from the semiconductor memory cells have logic low level, the first comparison signal Com1 is disabled unless all the bits have become logic high levels. For example, when the first to fourth channel data CH0_D, CH1_D, CH2_D and CH3_D, which are data being tested, have logic high levels, the first comparison signal Com1 is disabled unless all the first to fourth channel data CH0_D, CH1_D, CH2_D and CH3_D are changed to logic high levels, which means all the data are stored in failed memory cells. Also, the second comparison signal Com2 is enabled when the first to fourth channel data CH0_D, CH1_D, CH2_D and CH3_D, which are data being tested, have logic low levels. The second comparison signal Com2 is disabled when at least one channel data selected between the first to fourth channel data CH0_D, CH1_D, CH2_D and CH3_D is the high level.

Therefore, when the semiconductor memory apparatus is tested, the fact that the test result signal Test_R is enabled means that all the read-out data (e.g., all the first to fourth channel data CH0_D, CH1_D, CH2_D and CH3_D) have logic low levels. Hence, the fact that the test result signal Test_R is enabled means that the semiconductor memory apparatus does not include a failed memory cell. Moreover, when the semiconductor memory apparatus is tested, the fact that the test result signal Test_R is disabled means that at least one channel data among all the channel data (e.g., all the first to fourth channel data CH0_D, CH1_D, CH2_D and CH3_D) is the high level. Hence, the fact that the test result signal Test_R is disabled means that the semiconductor memory apparatus includes at least one failed memory cell or at least one failed channel.

In the case where one of the data outputted from all the channels (e.g., the first to fourth channel data CH0_D, CH0_D, CH0_D and CH3_D) has a different level as described above, it is necessary to identify which memory cell or channel has failed.

For example, it is assumed that only the first channel select signal CH_s0 selected between the first to fourth channel select signals CH_s0, CH_s1, CH_s2 and CH_s3 is enabled.

The channel selection detection block 300 enables the channel detection signal CH_dec when at least one channel select signal selected between the first to fourth channel select signals CH_s0, CH_s1, CH_s2 and CH_s3 is enabled.

The second comparison block 200 disables the second comparison signal Com2, which means that the second comparison signal Com2 remains at the low level, when the channel detection signal CH_dec is enabled.

The first comparison block 100 outputs the first channel data CH0_D as the first comparison signal Com1 when only the first channel select signal CH_s0 selected between the first to fourth channel select signals CH_s0, CH_s1, CH_s2 and CH_s3 is enabled.

The combined output block 400 outputs the first comparison signal Com1 as the test result signal Test_R when the second comparison signal Com2 is disabled. In a state in which the second comparison signal Com2 is disabled, whether the test result signal Test_R is enabled may be determined by whether the first comparison signal Com1 is enabled because the combined output block 400 enables the test result signal Test_R when either one of the first and second comparison signals Com1 and Com2 is enabled.

If the first channel select signal CH_s0 is enabled and the second to fourth channel select signals CH_s1, CH_s2 and CH_s3 are disabled, the first channel data CH0_D is outputted as the test result signal Test_R, which represents a test result with respect to the first channel data CH0_D.

The channel selection detection block 300 enables the channel detection signal CH_dec when any one channel select signal selected between the first to fourth channel select signals CH_s0, CH_s1, CH_s2 and CH_s3 is enabled, and while the channel detection signal CH_dec has a logic high level, the second comparison signal Com2 has a logic low level.

When one channel select signal selected between the first to fourth channel select signals CH_s0, CH_s1, CH_s2 and CH_s3 is enabled, the first comparison block 100 outputs the channel data corresponding to the enabled channel select signal as the first comparison signal Com1, and the combined output block 400 outputs the first comparison signal Com1 as the test result signal Test_R. Therefore, by outputting each of all channel data as a test result signal, it is possible to locate which memory cell or channel has a defect.

In the semiconductor memory apparatus in accordance with an embodiment, by determining whether the channel data outputted from all channels are the same data, it is possible to determine whether a fail has occurred or not for all memory cells which store the channel data. Also, by outputting the channel data outputted from each channel as a test result signal, it is possible to determine whether a fail has occurred in each channel, whereby a time required for a test may be shortened.

Figure 3:
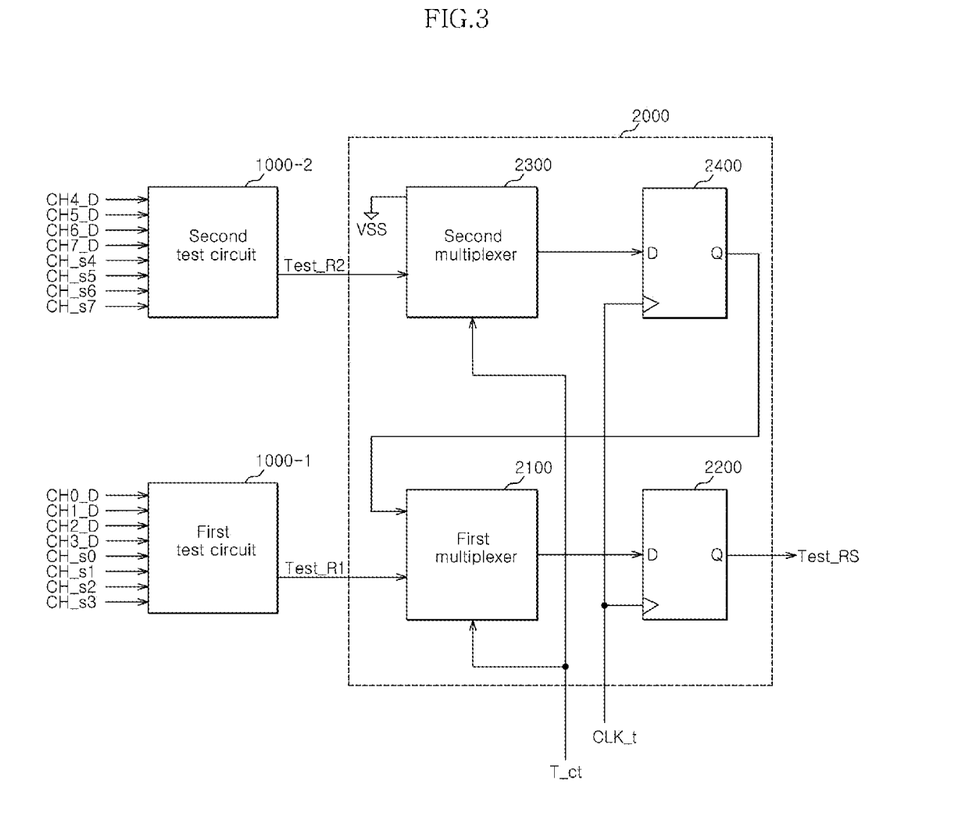
FIG. 3 is a configuration diagram illustrating a representation of an example of a semiconductor memory apparatus in accordance with an embodiment.

As shown in FIG. 3, a semiconductor memory apparatus in accordance with an embodiment may include first and second test circuits 1000-1 and 1000-2, and a test result output circuit 2000.

The first test circuit 1000-1 compares first to fourth channel data CH0_D, CH1_D, CH2_D and CH3_D to check whether the first to fourth channel data CH0_D, CH1_D, CH2_D and CH3_D have the same level, and outputs a first test result signal Test_R1 in response to first to fourth channel select signals CH_s0, CH_s1, CH_s2 and CH_s3. Also, the first test circuit 1000-1 outputs one channel data selected between the first to fourth channel data CH0_D, CH1_D, CH2_D and CH3_D as the first test result signal Test_R1 in response to the first to fourth channel select signals CH_s0, CH_s1, CH_s2 and CH_s3. For example, the first test circuit 1000-1 enables the first test result signal Test_R1 when all the first to fourth channel select signals CH_s0, CH_s1, CH_s2 and CH_s3 are enabled and all the first to fourth channel data CH0_D, CH1_D, CH2_D and CH3_D have the same level. The first test circuit 1000-1 disables the first test result signal Test_R1 when all the first to fourth channel select signals CH_s0, CH_s1, CH_s2 and CH_s3 are enabled and all the first to fourth channel data CH0_D, CH1_D, CH2_D and CH3_D are not the same level. Further, when only one channel select signal selected between the first to fourth channel select signals CH_s0, CH_s1, CH_s2 and CH_s3 is enabled, the first test circuit 1000-1 outputs the channel data corresponding to the enabled channel select signal, as the first test result signal Test_R1. For example, the first test circuit 1000-1 outputs the first channel data CH0_D as the first test result signal Test_R1 when only the first channel select signal CH_s0 is enabled. The first test circuit 1000-1 outputs the second channel data CH1_D as the first test result signal Test_R1 when only the second channel select signal CH_s1 is enabled. The first test circuit 1000-1 outputs the third channel data CH2_D as the first test result signal Test_R1 when only the third channel select signal CH_s2 is enabled. The first test circuit 1000-1 outputs the fourth channel data CH3_D as the first test result signal Test_R1 when only the fourth channel select signal CH_s3 is enabled.

The first test circuit 1000-1 may be configured in the same way as the configuration shown in FIGS. 1 and 2.

The second test circuit 1000-2 compares fifth to eighth channel data CH4_D, CH5_D, CH6_D and CH7_D to check whether the fifth to eighth channel data CH4_D, CH5_D, CH6_D and CH7_D have the same level, and outputs a second test result signal Test_R2, in response to fifth to eighth channel select signals CH_s4, CH_s5, CH_s6 and CH_s7. Also, the second test circuit 1000-2 outputs one channel data selected between the fifth to eighth channel data CH4_D, CH5_D, CH6_D and CH7_D as the second test result signal Test_R2 in response to the fifth to eighth channel select signals CH_s4, CH_s5, CH_s6 and CH_s7. For example, the second test circuit 1000-2 enables the second test result signal Test_R2 when all the fifth to eighth channel select signals CH_s4, CH_s5, CH_s6 and CH_s7 are enabled and all the fifth to eighth channel data CH4_D, CH5_D, CH6_D and CH7_D have the same level. The second test circuit 1000-2 disables the second test result signal Test_R2 when all the fifth to eighth channel select signals CH_s4, CH_s5, CH_s6 and CH_s7 are enabled but at least one channel data of the fifth to eighth channel data CH4_D, CH5_D, CH6_D and CH7_D have a different logic level than another channel data. Further, when only one channel select signal among the fifth to eighth channel select signals CH_s4, CH_s5, CH_s6 and CH_s7 is enabled, the second test circuit 1000-2 outputs the channel data corresponding to the enabled channel select signal as the second test result signal Test_R2. For example, the second test circuit 1000-2 outputs the fifth channel data CH4_D as the second test result signal Test_R2 when only the fifth channel select signal CH_s4 is enabled. The second test circuit 1000-2 outputs the sixth channel data CH5_D as the second test result signal Test_R2 when only the sixth channel select signal CH_s5 is enabled. The second test circuit 1000-2 outputs the seventh channel data CH6_D as the second test result signal Test_R2 when only the seventh channel select signal CH_s6 is enabled. The second test circuit 1000-2 outputs the eighth channel data CH7_D as the second test result signal Test_R2 when only the eighth channel select signal CH_s7 is enabled.

The second test circuit 1000-2 may be configured in the same way as the configuration shown in FIGS. 1 and 2, except that the signals inputted thereto and outputted therefrom are different.

The test result output circuit 2000 sequentially outputs the first and second test result signals Test_R1 and Test_R2 as a serial test result signal Test_RS in response to a test result output control signal T_ct. For example, the test result output circuit 2000 stores the respective first and second test result signals Test_R1 and Test_R2 when the test result output control signal T_ct is disabled, and sequentially outputs the first and second test result signals Test_R1 and Test_R2 as the serial test result signal Test_RS each time a test clock CLK_t transitions to a specified level when the test result output control signal T_ct is enabled.

The test result output circuit 2000 may include first and second multiplexers 2100 and 2300, and first and second flip-flops 2200 and 2400. The first multiplexer 2100 outputs the first test result signal Test_R1 when the test result output control signal T_ct is disabled, and outputs the output signal of the second flip-flop 2400 when the test result output control signal T_ct is enabled. The first flip-flop 2200 receives the output signal of the first multiplexer 2100 through an input terminal, receives the test clock CLK_t through a clock input terminal, and outputs the serial test result signal Test_RS through an output terminal. The second multiplexer 2300 outputs the second test result signal Test_R2 when the test result output control signal T_ct is disabled, and outputs a ground voltage VSS as the voltage level of its output signal when the test result output control signal T_ct is enabled. The second flip-flop 2400 receives the output signal of the second multiplexer 2300 through an input terminal, and receives the test clock CLK_t through a clock input terminal.

The semiconductor memory apparatus in accordance with an embodiment may operate as follows.

The first test circuit 1000-1 compares the first to fourth channel data CH0_D, CH1_D, CH2_D and CH3_D to check whether the first to fourth channel data CH0_D, CH1_D, CH2_D and CH3_D have the same level, and outputs the first test result signal Test_R1, in response to the first to fourth channel select signals CH_s0, CH_s1, CH_s2 and CH_s3. Further, the first test circuit 1000-1 outputs one channel data selected between the first to fourth channel data CH0_D, CH1_D, CH2_D and CH3_D as the first test result signal Test_R1 in response to the first to fourth channel select signals CH_s0, CH_s1, CH_s2 and CH_s3.

The second test circuit 1000-2 compares the fifth to eighth channel data CH4_D, CH5_D, CH6_D and CH7_D to check whether the fifth to eighth channel data CH4_D, CH5_D, CH6_D and CH7_D have the same level, and outputs the second test result signal Test_R2 in response to the fifth to eighth channel select signals CH_s4, CH_s5, CH_s6 and CH_s7. Further, the second test circuit 1000-2 outputs one channel data among the fifth to eighth channel data CH4_D, CH5_D, CH6_D and CH7_D as the second test result signal Test_R2 in response to the fifth to eighth channel select signals CH_s4, CH_s5, CH_s6 and CH_s7.

If the first and second test result signals Test_R1 and Test_R2 are generated from the first and second test circuits 1000-1 and 1000-2, the test result output control signal T_ct is disabled.

If the test result output control signal T_ct is disabled, the first and second multiplexers 2100 and 2300 transfer the first and second test result signals Test_R1 and Test_R2 to the first and second flip-flops 2200 and 2400, respectively.

The first and second flip-flops 2200 and 2400 store the first and second test result signals Test_R1 and Test_R2 when the test clock CLK_t transitions to the specified level.

After the first and second test result signals Test_R1 and Test_R2 are respectively stored in the first and second flip-flops 2200 and 2400, the test result output control signal T_ct is enabled.

If the test clock CLK_t transitions to the specified level after the test result output control signal T_ct is enabled, the signal stored in the first flip-flop 2200, that is, the first test result signal Test_R1 is outputted as the serial test result signal Test_RS. At this time, the signal stored in the second flip-flop 2400, that is, the second test result signal Test_R2 is stored in the first flip-flop 2200. Thereafter, when the test clock CLK_t transitions to the specified level, the signal stored in the first flip-flop 2200, that is, the second test result signal Test_R2 is outputted as the serial test result signal Test_RS.

When the semiconductor memory apparatus in accordance with an embodiment is tested, in the case where all channel select signals are enabled, whether data outputted from all channels have the same logic level may be determined by a serial test result signal outputted through one signal line. Also, by enabling only one channel select signal among the channel select signals, only the channel data corresponding to the enabled channel select signal may be outputted as a serial test result signal.

As a consequence, when the semiconductor memory apparatus in accordance with an embodiment is tested, whether a failed memory cell exists in the semiconductor memory apparatus may be determined by comparing the data outputted from all channels with one another. Also, in the case where it is determined that a failed memory cell exists, since it is possible to locate the failed channel outputting wrong date.

While various embodiments have been described above, it will be understood to those skilled in the art that the embodiments described are by way of example only. Accordingly, the semiconductor memory apparatus described herein should not be limited based on the described embodiments.

What is claimed is:

1. A semiconductor memory apparatus comprising:
    a first comparison block configured to compare a plurality of channel data with one another and generate a first comparison signal when at least two channel select signals among a plurality of channel select signals are enabled, and output one of the plurality of channel data as the first comparison signal when only one channel select signal is enabled;
    a second comparison block configured to compare the plurality of channel data and generate a second comparison signal when at least two channel select signals among the plurality of channel select signals are enabled and a channel detection signal is disabled, and output the second comparison signal having a predetermined logic level regardless of the channel data when the channel detection signal is enabled;
    a channel selection detection block configured to enable the channel detection signal when only one channel select signal among the plurality of channel select signals is enabled and disable the channel detection signal when at least two channel select signals among the plurality of channel select signals are enabled; and
    a combined output block configured to enable a test result signal when at least one comparison signal of the first and second comparison signals is enabled.

2. The semiconductor memory apparatus according to claim 1,
    wherein the first comparison block compares the plurality of channel data and generates the first comparison signal, when all the plurality of channel select signals are enabled, and
    wherein, when one channel select signal among the plurality of channel select signals is enabled, the first comparison block outputs channel data corresponding to the enabled channel select signal as the first comparison signal.

3. The semiconductor memory apparatus according to claim 1,
    wherein the first comparison block enables the first comparison signal if the plurality of channel data have a first specified level, when all the plurality of channel select signals are enabled, and
    wherein the second comparison block enables the second comparison signal if the plurality of channel data have a second specified level, when all the plurality of channel select signals are enabled.

4. The semiconductor memory apparatus according to claim 3, wherein the first specified level is a level that is different from the second specified level.

5. The semiconductor memory apparatus according to claim 1,
    wherein the second comparison signal remains at a specified level when the channel detection signal is enabled, and
    wherein the second comparison block compares the plurality of channel data and generates the second comparison signal, when all the plurality of channel select signals are enabled in a state in which the channel detection signal is disabled.

6. A semiconductor memory apparatus comprising:
a first comparison block configured to generate a first comparison signal, which represents one of a plurality of channel data if only one of a plurality of channel select signals is enabled, and has a predetermined logic level by comparing the plurality of channel data with one another if at least two channel select signals among the plurality of channel select signals are enabled;
a second comparison block configured to generate a second comparison signal, which has a predetermined logic level by comparing the plurality of channel data with one another if at least two channel select signals among the plurality of channel select signals are enabled and output the second comparison signal having a predetermined logic level regardless of the channel data when a channel detection signal is enabled;
a channel selection detection block configured to enable the channel detection signal when only one channel select signal among the plurality of channel select signals is enabled; and
a combined output block configured to enable a test result signal when at least one comparison signal of the first and second comparison signals is enabled.

7. The semiconductor memory apparatus according to claim 6,
wherein the first comparison block compares the plurality of channel data and generates the first comparison signal, when all the plurality of channel select signals are enabled, and
wherein, when one channel select signal among the plurality of channel select signals is enabled, the first comparison block outputs channel data corresponding to the enabled channel select signal as the first comparison signal.

8. The semiconductor memory apparatus according to claim 6,
wherein the first comparison block enables the first comparison signal if the plurality of channel data have a first specified level, when all the plurality of channel select signals are enabled, and
wherein the second comparison block enables the second comparison signal if the plurality of channel data have a second specified level, when all the plurality of channel select signals are enabled.

9. The semiconductor memory apparatus according to claim 8, wherein the first specified level is a level that is different from the second specified level.

10. The semiconductor memory apparatus according to claim 6,
wherein the second comparison signal remains at a specified level when the channel detection signal is enabled, and
wherein the second comparison block compares the plurality of channel data and generates the second comparison signal, when all the plurality of channel select signals are enabled in a state in which the channel detection signal is disabled.

* * * * *